(12) United States Patent
Zorzi et al.

(10) Patent No.: US 10,379,231 B2
(45) Date of Patent: Aug. 13, 2019

(54) RADIATION DETECTION ELEMENT, RADIATION DETECTOR AND RADIATION DETECTION APPARATUS

(71) Applicants: FONDAZIONE BRUNO KESSLER, Trento (IT); HORIBA, Ltd., Kyoto (JP)

(72) Inventors: Nicola Zorzi, Trento (IT); Gabriele Giacomini, Trento (IT); Giacomo Borghi, Trento (IT); Antonino Picciotto, Trento (IT); Francesco Ficorella, Trento (IT); Daisuke Matsunaga, Kyoto (JP)

(73) Assignees: FONDAZIONE BRUNO KESSLER, Trento (IT); HORIBA, LTD., Kyoto (JP)

( * ) Notice: Subject to any disclaimer, the term of this patent is extended or adjusted under 35 U.S.C. 154(b) by 0 days.

(21) Appl. No.: 16/028,597

(22) Filed: Jul. 6, 2018

(65) Prior Publication Data

US 2019/0011577 A1   Jan. 10, 2019

(30) Foreign Application Priority Data

Jul. 7, 2017 (JP) .................................. 2017-134023

(51) Int. Cl.
*H01L 31/115* (2006.01)
*H01L 31/0224* (2006.01)
(Continued)

(52) U.S. Cl.
CPC ................ *G01T 1/241* (2013.01); *G01T 1/24* (2013.01); *G01T 1/244* (2013.01);
(Continued)

(58) Field of Classification Search
CPC . H01L 31/0224; H01L 31/085; H01L 31/115; G01T 1/24; G01T 1/241; G01T 1/244
See application file for complete search history.

(56) References Cited

U.S. PATENT DOCUMENTS 10,126,437 B1 * 11/2018 Danielsson ............. G01T 1/241
2013/0341520 A1   12/2013 Kostamo
(Continued)

FOREIGN PATENT DOCUMENTS

JP        2014002155 A     1/2014

OTHER PUBLICATIONS

Extended European Search Report dated Nov. 20, 2018 from European Application No. 18182286.7.

*Primary Examiner* — David P Porta
(74) *Attorney, Agent, or Firm* — Lucas & Mercanti, LLP

(57) ABSTRACT

A radiation detection element comprises: a semiconductor part generating an electric charge by entrance of radiation; a signal output electrode provided at the semiconductor part and outputting a signal caused by the electric charge; a potential gradient generation electrode provided at the semiconductor part, for applying voltage such that a potential gradient in which a potential varies toward the signal output electrode is generated inside the semiconductor part; a collection electrode provided at the semiconductor part, for collecting electric charges not derived from radiation; an insulating film provided on a side of the semiconductor part where the signal output electrode is located; and a conductive layer provided between the insulating film and a part of the semiconductor part, and having electric resistance lower than the electric resistance of the semiconductor part and higher than the electric resistance of the collection electrode. The conductive layer is located at a position where a distance from the signal output electrode is equal to or longer than a distance between the collection electrode and the signal output electrode.

7 Claims, 13 Drawing Sheets

(51) Int. Cl.
    *G01T 1/24*    (2006.01)
    *H01L 31/08*   (2006.01)
(52) U.S. Cl.
    CPC ........ *H01L 31/0224* (2013.01); *H01L 31/085* (2013.01); *H01L 31/115* (2013.01)

(56) References Cited

U.S. PATENT DOCUMENTS

2017/0125625 A1* 5/2017 Cauffiel ................ H01L 31/115
2018/0350851 A1* 12/2018 Yoshida ................ H01L 27/144

* cited by examiner

F I G. 4
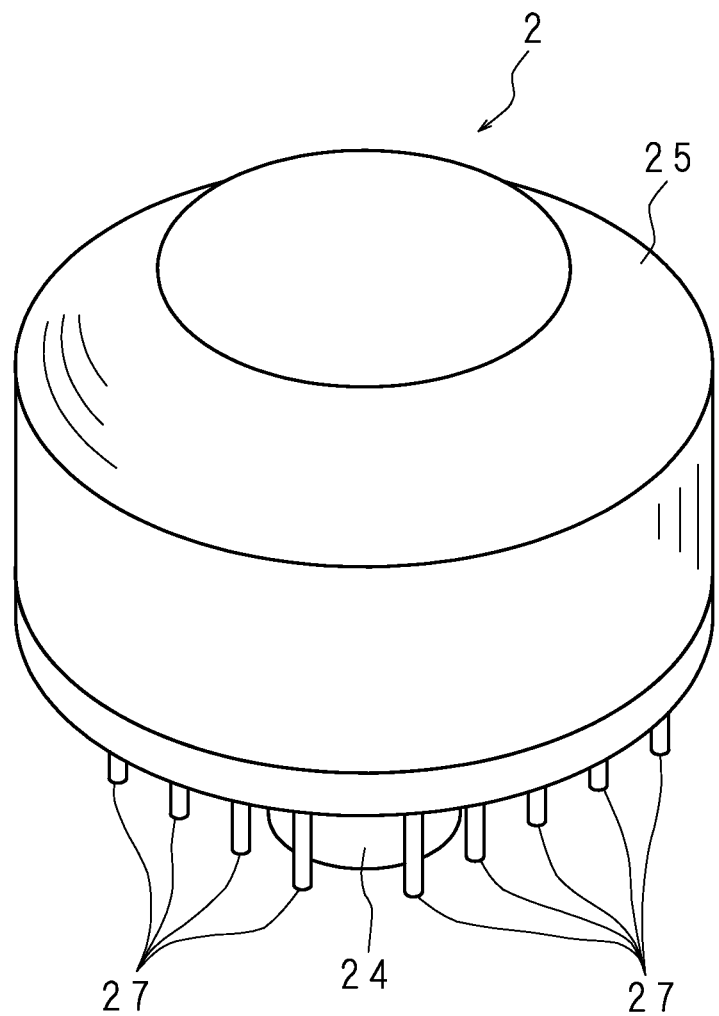

RADIATION DETECTION ELEMENT, RADIATION DETECTOR AND RADIATION DETECTION APPARATUS

CROSS-REFERENCE TO RELATED APPLICATION

This non-provisional application claims priority under 35 U.S.C. § 119(a) on Patent Application No. 2017-134023 filed in Japan on Jul. 7, 2017, the entire contents of which are hereby incorporated by reference.

FIELD

The present invention relates to a radiation detection element using a semiconductor, a radiation detector and a radiation detection apparatus.

BACKGROUND

Some radiation detection elements for detecting radiation such as X-rays use a semiconductor. An example of the radiation detection element using a semiconductor includes, a silicon drift detector (SDD). Around the surface of a radiation detection element using silicon (Si), an interface between a Si layer and SiO$_2$ which is an insulating film is present. In a depleted region in the interface, an electric charge not derived from radiation is generated. The electric charge not derived from radiation is an electric charge different from the electric charge generated by the entrance of incident radiation. The electric charge generated in the depleted region in the interface is to be leak current, causing noise.

Positive electric charge fixed in the insulating film generates at the interface an accumulation layer in which negative charges may reside. In the case where the accumulation layer is present, the generation of electric charges is suppressed. However, at operation of a radiation detection element, voltage is applied to the radiation detection element, which generates an electric field around the surface of the radiation detection element. The electric field affects the accumulation layer, which forms a depleted region at the interface, and makes it easy for an electric charge to be generated. Japanese Patent Application Laid-Open Publication No. 2014-2155 discloses a technique of collecting electric charges generated around the surface of a SDD for reducing noise.

SUMMARY

It is difficult to control the amount of positive charges in an insulating film, and the interface between the insulating film and the Si layer is easily depleted and negative charges are generated in the depleted region at the interface in the case where the amount of positive charges in the insulating film is small. If the generated negative charges flow from the interface into the Si layer, current irrelevant to the entrance of radiation flows in the Si layer, which causes noise. The conventional radiation detection element cannot sufficiently reduce noise, and further reduction of noise has been desired.

The present disclosure has been made in view of the above circumstances, and aims to provide a radiation detection element, a radiation detector and a radiation detection apparatus capable of further reducing noise.

A radiation detection element according to the present disclosure, comprising a semiconductor part generating an electric charge by the entrance of radiation, the semiconductor part being provided with a signal output electrode outputting a signal caused by the electric charge, a potential gradient generation electrode for applying voltage such that a potential gradient in which a potential varies toward the signal output electrode is generated in the semiconductor part, and a collection electrode for collecting electric charges not derived from radiation, further comprises: an insulating film provided on a side of the semiconductor part where the signal output electrode is located; and a conductive layer located between the insulating film and a part of the semiconductor part, and having electric resistance lower than that of the semiconductor part and higher than that of the collection electrode, the conductive layer being located at a position where a distance from the signal output electrode is equal to or longer than a distance between the collection electrode and the signal output electrode.

According to the present disclosure, the radiation detection element includes, between the semiconductor part and the insulating film, a conductive layer with electric resistance lower than that of the semiconductor part and higher than that of the collection electrode. The electric charge not derived from radiation, which is generated at the interface between the conductive layer and the insulating film is easy to move in the conductive layer and to be collected by the collection electrode.

The radiation detection element according to the present disclosure further comprises multiple potential gradient generation electrodes located at different distances from the signal output electrode, and the conductive layer is provided at a position between the multiple potential gradient generation electrodes.

According to the present disclosure, since a conductive layer is present between multiple potential gradient generation electrodes located at different distances from the signal output electrode, an electric field is generated inside the conductive layer and the electric charges move in the conductive layer.

The radiation detection element according to the present disclosure further comprises multiple conductive layers at different distances from the signal output electrode.

According to the present disclosure, as the radiation detection element comprises multiple conductive layers at different distances from the signal output electrode, electric charges generated at multiple portions of the radiation detection element move in the conductive layer and are collected by the collection electrode.

In the radiation detection element according to the present disclosure, the potential gradient generation electrode has a shape of a ring with a disconnected portion, and electric charges move between the multiple conductive layers through the disconnected portion of the potential gradient generation electrode.

According to the present disclosure, as electric charges move between multiple conductive layers that are located at different distances from the signal output electrode through the disconnected portion of the potential gradient generation electrode, electric charges generated at multiple portions of the radiation detection element move in the conductive layer and are collected by the collection electrode.

The radiation detector according to the present disclosure comprises the radiation detection element according to the present disclosure, a circuit board on which the radiation detection element is mounted, and a base plate holding the radiation detection element and the circuit board.

According to the present disclosure, electric charges not derived from radiation tend to be collected by the collection electrode, but tend not to flow in the semiconductor part. This makes it difficult for the current irrelevant to the entrance of radiation to flow in the semiconductor part, thereby reducing noise in the radiation detector.

The radiation detection apparatus according to the present disclosure comprises the radiation detection element according to the present disclosure, an output part outputting a signal in accordance with energy of radiation detected by the radiation detection element, and a spectrum generation part generating a spectrum of the radiation based on the signal output by the output part.

According to the present disclosure, it is difficult for the current irrelevant to the entrance of radiation to flow in the semiconductor part of the radiation detection element, so that noise is reduced in the radiation detection apparatus.

A radiation detection apparatus according to the present disclosure detecting radiation generated from a sample irradiated with radiation, comprises: an irradiation part irradiating a sample with radiation; the radiation detection element according to the present disclosure detecting radiation generated from the sample; an output part outputting a signal corresponding to energy of radiation detected by the radiation detection element; a spectrum generation part generating a spectrum of the radiation based on the signal output by the output part; and a display part displaying a spectrum generated by the spectrum generation part.

According to the present disclosure, it is difficult for the current irrelevant to the entrance of incident radiation to flow in the semiconductor part, so that noise is reduced in the radiation detection apparatus.

According to the present disclosure, noise caused by the radiation detection element is reduced. Therefore, the radiation detector and the radiation detection apparatus provided with the radiation detection element may, for example, detect radiation with high precision, thereby producing beneficial effects.

The above and further objects and features will more fully be apparent from the following detailed description with accompanying drawings.

BRIEF DESCRIPTION OF DRAWINGS

FIG. 4 is a schematic perspective view of a radiation detector comprising a radiation detection element;

DETAILED DESCRIPTION

The present disclosure will specifically be described below with reference to the drawings illustrating the embodiments thereof.

Embodiment 1

Figure 1:
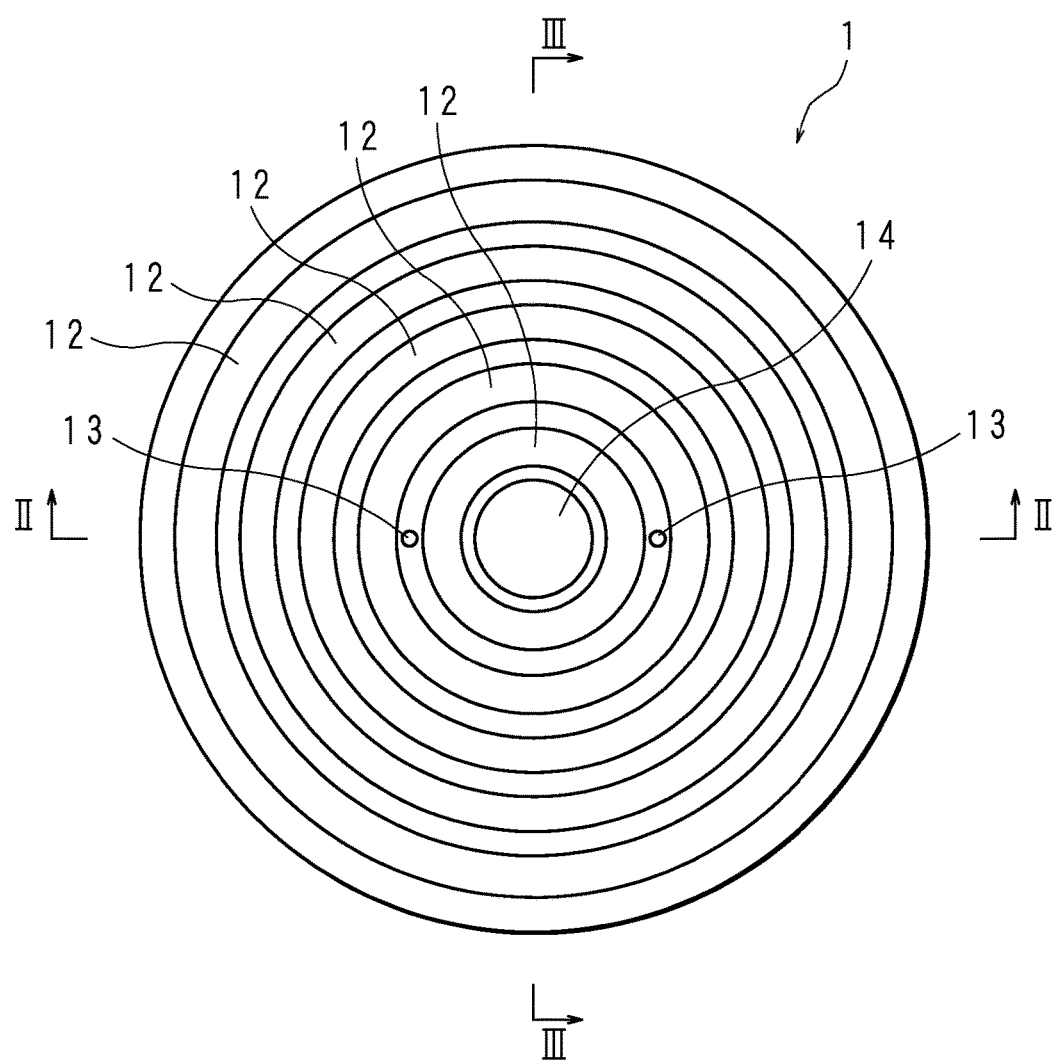
FIG. 1 is a schematic plan view of a radiation detection element according to Embodiment 1.
Figure 2:
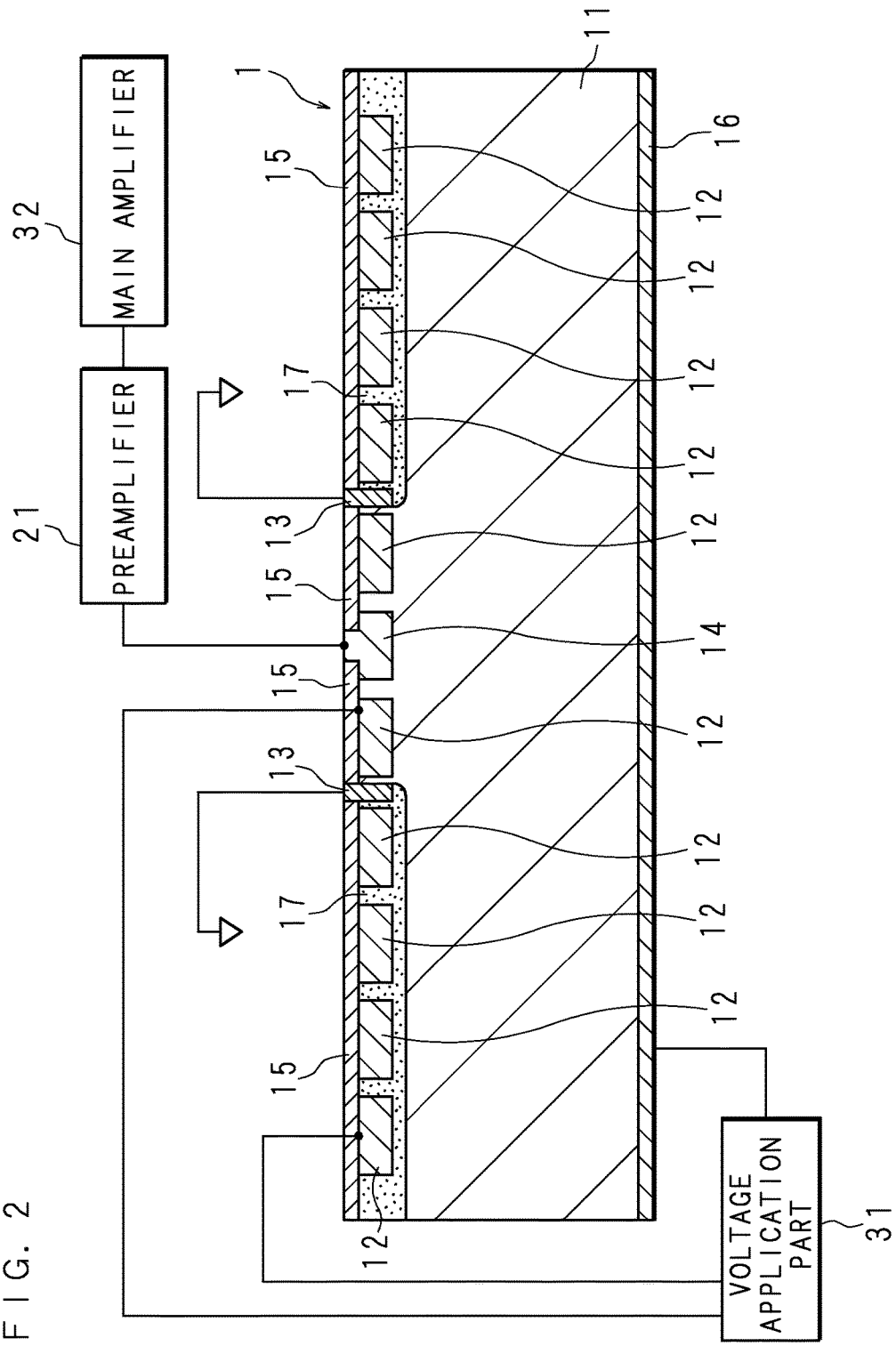
FIG. 2 is a block diagram illustrating a cross-section structure of the radiation detection element taken along the line II-II in FIG. 1, and electrical connection of the radiation detection element.
Figure 3:
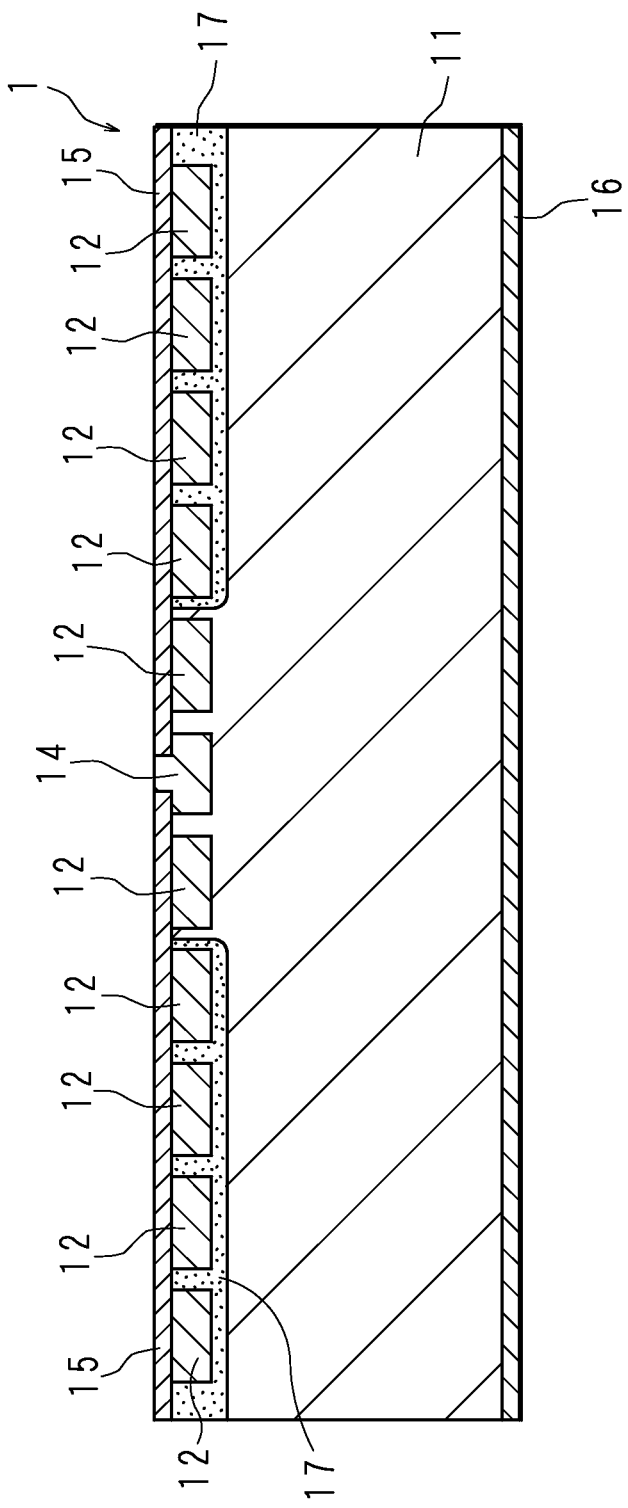
FIG. 3 is a schematic section view of the radiation detection element taken along the line III-III in FIG. 1.

FIG. 1 is a schematic plan view of a radiation detection element 1 according to Embodiment 1. FIG. 2 is a block diagram illustrating the cross-section structure of the radiation detection element 1 taken along the line II-II and electrical connection of the radiation detection element 1. FIG. 3 is a schematic section view of the radiation detection element 1 taken along the line III-III in FIG. 1. The radiation detection element 1 is a SDD. The radiation detection element 1 comprises a disc-shaped Si layer 11 made of silicon (Si). The constituent of the Si layer 11 is, for example, n-type Si. The Si layer 11 is a semiconductor part. At the middle on one surface of the Si layer 11, a signal output electrode 14 is provided, which outputs a signal at the time of detecting radiation. The signal output electrode 14 is made of Si of the same type as that of the Si layer 11, which is doped with specific dopants such as phosphorus. For example, the constituent of the signal output electrode 14 is n+Si. Moreover, on one surface of the Si layer 11, multiple curved electrodes (potential gradient generation electrodes) 12 having the shape of multiple rings are provided. The curved electrode 12 is constituted by Si of a type different from that of the Si layer 11. The constituent of the curved electrode 12 is, for example, p+Si in which Si is doped with a specific type of dopants such as boron. The multiple curved electrodes 12 arranged in the shape of rings are substantially concentric, while the signal output electrode 14 is located at the substantial center of the multiple curved electrodes 12.

Though five curved electrodes 12 are illustrated in the drawing, a larger number of curved electrodes 12 are formed in practice. It is noted that the shape of each curved electrode 12 may be a deformed circular ring, and the multiple curved electrodes 12 may not necessarily be concentric. Moreover, the signal output electrode 14 may be located at a position other than the center of the multiple curved electrodes 12, or may be located at a position other than the middle on one surface of the Si layer 11. The radiation detection element 1 may have a droplet shape. The shape of the Si layer 11 may be a shape other than the circular-disc shape, and may be a square shape, a rectangular shape or a trapezoidal shape, etc.

At the opposite surface of the Si layer 11, a rear electrode 16 serving as an electrode to which bias voltage is applied is formed on substantially the entire surface thereof. The rear electrode 16 is constituted by Si of a type different from that of the Si layer 11. For example, the constituent of the rear electrode 16 is p+Si, if that of the Si layer 11 is n-type Si. An insulating film 15 is present at the upper side of one surface of the Si layer 11. The insulating film 15 is an oxide film with a main constituent of $SiO_2$. It is noted that the insulating film 15 may include a substance other than $SiO_2$ as a main constituent, such as nitride. The insulating film 15 is not illustrated in FIG. 1. The insulating film 15 covers the curved electrodes 12. The rear electrode 16 is connected to a voltage application part 31. Among the multiple curved electrodes 12, the curved electrode 12 at the innermost side and the curved electrode 12 at the outermost side are connected to the voltage application part 31.

The voltage application part 31 applies voltage in such a manner that the potential at the innermost curved electrode 12 is highest whereas the potential at the outermost curved electrode 12 is lowest. Moreover, the radiation detection element 1 is so configured that predetermined electric resistance is generated between adjacent curved electrodes 12 that are located at different distances from the signal output electrode 14. For example, a constituent of a portion between adjacent curved electrodes 12 is adjusted to form a resistive channel for connecting the two curved electrodes 12. That is, the multiple curved electrodes 12 are linked together through electric resistance. As voltage is applied to such curved electrodes 12 from the voltage application part 31, the curved electrodes 12 have potentials monotonically increasing in sequence from the curved electrode 12 at the outer side to the curved electrode 12 at the inner side. That is, the curved electrodes 12 have potentials increasing in sequence from the curved electrode 12 distant from the signal output electrode 14 toward the curved electrode 12 close to the signal output electrode 14. It is to be noted that an adjacent pair of curved electrodes 12 with the same potential may also be included in the multiple curved electrodes 12.

The potentials of the curved electrodes 12 generate an electric field (a potential gradient) in which the potential is increased toward the signal output electrode 14 and the potential is decreased toward a position distant from the signal output electrode 14 in a stepwise manner. Furthermore, the voltage application part 31 applies voltage to the rear electrode 16 such that the potential at the rear electrode 16 is intermediate between the potential of the innermost curved electrode 12 and the potential of the outermost curved electrode 12. Accordingly, an electric field in which the potential is increased toward the signal output electrode 14 is generated inside the Si layer 11.

The signal output electrode 14 is connected to a preamplifier 21. A main amplifier 32 is connected to the preamplifier 21. The radiation detection element 1 is formed in the shape of a circular disc as a whole, and is used while the surface on the side where the rear electrode 16 is formed serves as a radiation incident surface. The shape of the radiation detection element 1 may be a shape other than the circular disc shape. Radiation such as X-ray, photons in general (including UV and visible light), electron beam or other charged particle beam passes through the rear electrode 16 and enters inside the Si layer 11, which generates electric charges of an amount corresponding to the energy of radiation absorbed inside the Si layer 11. The generated electric charges are electrons and holes. The generated electric charges are moved by the electric field inside the Si layer 11, and one type is concentrated at the signal output electrode 14 while flowing therein. In the present embodiment, the electrons generated by the entrance of radiation move and flow into the signal output electrode 14 in the case where the signal output electrode 14 is the n type. The electric charges flowed into the signal output electrode 14 are output as current signals and are input into the preamplifier 21. The preamplifier 21 converts the current signal into a voltage signal to be output to the main amplifier 32. The main amplifier 32 amplifies the voltage signal from the preamplifier 21, and outputs a signal with an amplitude corresponding to the energy of the incident radiation which entered the radiation detection element 1. The main amplifier 32 corresponds to an output part in the present disclosure.

Figure 5:
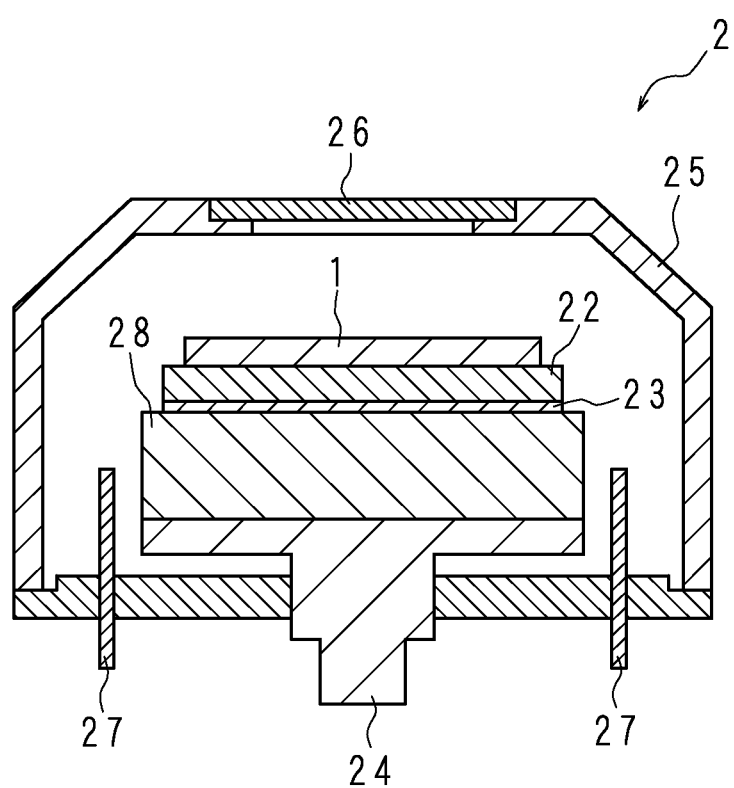
FIG. 5 is a schematic section view of a radiation detector.

FIG. 4 is a schematic perspective view of a radiation detector 2 including the radiation detection element 1. FIG. 5 is a schematic section view of the radiation detector 2. The radiation detector 2 includes a housing 25 having a shape of a cylinder with one end thereof being connected to a truncated cone. At an end of the housing 25, a window 26 is formed which allows the radiation to pass. A radiation detection element 1, a circuit board 22, a shielding plate 23, a cooling part 28 and a base plate 24 are arranged inside the housing 25. The base plate 24 is also referred to as a stem. The cooling part 28 is a Peltier device, for example. The radiation detection element 1 is mounted to a surface of the circuit board 22 and is located at a position facing the window 26. A wiring is formed and the preamplifier 21 is mounted on the circuit board 22. The shielding plate 23 is interposed between the cooling part 28 and the circuit board 22, and is thermally in contact with a heat absorbing portion of the cooling part 28. The heat dissipating portion of the cooling part 28 is thermally in contact with the base plate 24.

The base plate 24 has a flat plate portion on which the cooling part 28 is mounted and fixed, as well as a portion penetrating the bottom part of the housing 25. By the circuit board 22 on which the radiation detection element 1 is mounted being fixed to the cooling part 28 with the shielding plate 23 interposed in between, and by the cooling part 28 being fixed to the base plate 24, the base plate 24 holds the radiation detection element 1 and the circuit board 22. The shielding plate 23 is formed with a material for shielding X-rays. The shielding plate 23 shields X-rays, generated from the cooling part 28 or the base plate 24 when radiation enters the cooling part 28 or the base plate 24, so as to prevent it from entering the radiation detection element 1. The heat from the radiation detection element 1 is absorbed by the cooling part 28 through the circuit board 22 and the shielding plate 23, is transmitted from the cooling part 28 to the base plate 24, and is dissipated to the outside the radiation detector 2 through the base plate 24. Furthermore, the radiation detector 2 includes multiple lead pins 27 penetrating the bottom part of the housing 25. The lead pins 27 are connected to the circuit board 22 by a method such as wire bonding. Application of voltage to the radiation detection element 1 by the voltage application part 31 and output of signals from the preamplifier 21 to the main amplifier 32 are performed through the lead pins 27.

Figure 6:
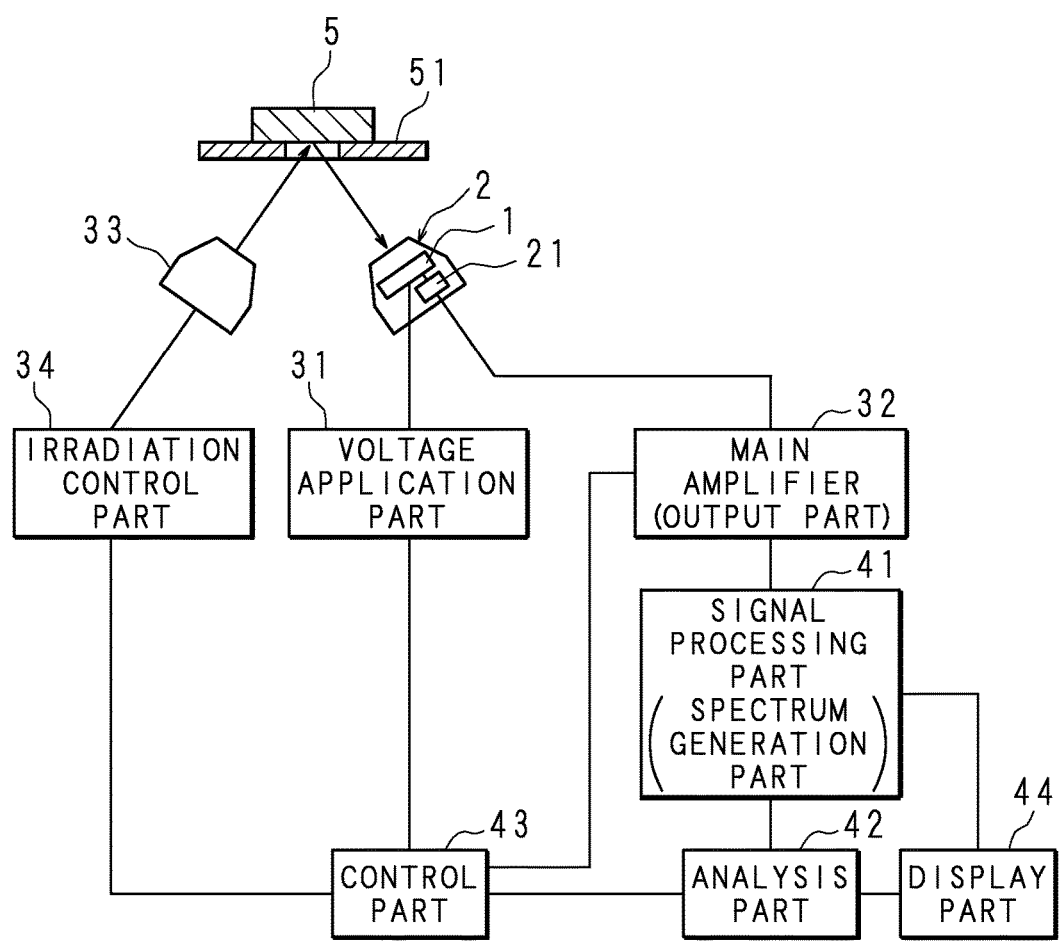
FIG. 6 is a block diagram illustrating the functional configuration of a radiation detection apparatus.

FIG. 6 is a block diagram illustrating the functional configuration of a radiation detection apparatus. The radiation detector 2 includes the radiation detection element 1 and the preamplifier 21. The voltage application part 31 and the main amplifier 32 are located outside the radiation detector 2. A part of the preamplifier 21 may be included in the radiation detector 2, whereas the other parts thereof may be located outside the radiation detector 2. The radiation detection apparatus includes a sample holding part 51 holding a sample 5, an irradiation part 33 irradiating the sample 5 with radiation such as X-ray, electron beam or particle beam, and an irradiation control part 34 controlling the operation of the irradiation part 33. The irradiation part 33 irradiates the sample 5 with radiation, to generate radiation such as X-ray fluorescence at the sample 5. The radiation detector 2 is located at a position where the radiation generated from the sample 5 may enter the radiation detection element 1. In the drawing, radiation is indicated by arrows. As described earlier, the main amplifier 32 outputs a signal corresponding to the energy of radiation detected by the radiation detection element 1. The main amplifier 32 is connected to a signal processing part 41 for processing the output signals. The signal processing part 41 performs processing of counting signals output from the main amplifier 32 for each of values and generating the relationship between the energy of radiation and the counted values, i.e. a spectrum of radiation. The signal processing part 41 corresponds to a spectrum generation part in the present disclosure.

The signal processing part 41 is connected to an analysis part 42. The analysis part 42 is configured to include an arithmetic operation part performing arithmetic operation and a memory in which data is stored. The signal processing part 41 outputs data indicating the generated spectrum to the analysis part 42. The analysis part 42 receives data input from the signal processing part 41, and performs processing of identifying an element contained in the sample 5 based on the spectrum indicated by the input data. The analysis part 42 may also perform processing of calculating the amount of various types of elements contained in the sample 5. The analysis part 42 is connected to a display part 44 such as a liquid-crystal display. The display part 44 displays the result of the processing performed by the analysis part 42. Moreover, the display part 44 is connected to the signal processing part 41, and displays a spectrum generated by the signal processing part 41. Furthermore, the radiation detection apparatus includes a control part 43 controlling the operation of the entire apparatus. The control part 43 is connected to the voltage application part 31, the main amplifier 32, the irradiation control part 34 and the analysis part 42, to control the operation of the parts. The control part 43 is constituted by a personal computer, for example. The control part 43 may be configured to accept the operation of the user, and to control the parts of the radiation detection apparatus in accordance with the accepted operation. Furthermore, the control part 43 and the analysis part 42 may be constituted by the same computer.

As illustrated in FIG. 1 to FIG. 3, collection electrodes 13 are formed on one surface of the Si layer 11. Each collection electrode 13 is an electrode for collecting electric charges not derived from radiation. The collection electrode 13 is interposed between the curved electrode 12 closest to the signal output electrode 14 and the curved electrode 12 second closest to the signal output electrode 14. In the present embodiment, an example is illustrated where two collection electrodes 13 are provided. The signal output electrode 14, the curved electrodes 12 and the collection electrodes 13 are located on the same side of the Si layer 11. The constituent of the collection electrode 13 is Si of the same type as that of the signal output electrode 14, which is doped with dopants as in the signal output electrode 14. In the present embodiment, the radiation detection element 1 is provided with two collection electrodes 13, which are located at symmetrical positions around the signal output electrode 14 in plan view. The collection electrode 13 is connected to a potential higher than that of the curved electrode 12 located at a position where a distance from the signal output electrode 14 is longer than the distance between the collection electrode 13 and the signal output electrode 14. For example, the collection electrode 13 is connected to the ground. It is to be noted that the number of the collection electrodes 13 may be one, three or more.

Furthermore, between a part of the Si layer 11 and the insulating film 15 on the side of the Si layer 11 where the signal output electrode 14, the curved electrodes 12 and the collection electrodes 13 are located, a conductive layer 17 with electric resistance lower than that of the Si layer 11 and higher than that of the signal output electrode 14 and the collection electrode 13 is provided. Here, the level of the electric resistance means the magnitude of electric resistivity. The constituent of the conductive layer 17 is Si of the same type as the Si layer 11. The conductive layer 17 is constituted by increasing the concentration of dopants to be higher than that of the Si layer 11. Moreover, the concentration of the dopants in the conductive layer 17 is lower than the dopant concentration in the signal output electrode 14 and the collection electrode 13. For example, the Si layer 11 has the dopant concentration of $10^{12}$ $(cm^{-3})$, the conductive layer 17 has the dopant concentration of $10^{14}$ to $10^{17}$ $(cm^{-3})$, and the signal output electrode 14 and the collection electrode 13 have the dopant concentration of $10^{19}$ $(cm^{-3})$. As differences exist in the dopant concentration, the Si layer 11, the collection electrode 13 and the conductive layer 17 have different values of conductivity and electric resistance. That is, the electric resistance is lower in the conductive layer 17 than that in the Si layer 11, since the conductive layer 17 has higher dopant concentration than the Si layer 11. Moreover, the concentration of the dopants in the conductive layer 17 is lower than that of the dopants in the collection electrode 13, which makes the electric resistance in the conductive layer 17 higher than that in the collection electrode 13. The electric resistance of the conductive layer 17 being higher than the electric resistance of the collection electrode 13 prevents junction breakdown between the curved electrode 12 and the collection electrode 13.

The conductive layer 17 is provided at a position where the distance from the signal output electrode 14 is equal to or longer than the distance between the collection electrode 13 and the signal output electrode 14. As illustrated in FIGS. 2 and 3, each component of the conductive layer 17 is present at a position where the distance from the signal output electrode 14 to the component of the conductive layer 17 is equal to or longer than the distance from the signal output electrode 14 to the collection electrode 13. That is, the conductive layer 17 is provided at a position on the outer side of the collection electrode 13 when centering on the signal output electrode 14 in plan view. The conductive layer 17 is preferably in contact with the insulating film 15. A part of the conductive layer 17 is in contact with the collection electrode 13. In the example illustrated in FIGS. 1 to 3, the conductive layer 17 located between the curved electrode 12 which is closest to the signal output electrode 14 and the curved electrode 12 which is second closest to the signal output electrode 14 is in contact with the collection electrode 13.

In the conductive layer 17, similarly to the inside of the Si layer 11, the curved electrodes 12 generate an electric field in which the potential is increased toward the signal output electrode 14. Electric charges not derived from radiation entering the radiation detection element 1 is generated at an interface between the conductive layer 17 and the insulating film 15 or at an interface between the Si layer 11 and the insulating film 15, e.g., an interface between Si and $SiO_2$. The electric charges not derived from radiation are not the electric charges generated in accordance the energy of radiation absorbed in the Si layer 11, and are generated at a timing irrespective of the entrance of radiation. The generated electric charges include electrons and holes. The holes are collected by the curved electrodes 12. The electrons generated in the depleted region at the interface are moved toward the signal output electrode 14 by the electric field. The flow of such electrons is to be leak current. In the case where the electrons not derived from radiation flow into the signal output electrode 14, a signal irrelevant to the entrance of radiation is output from the signal output electrode 14, which results in noise.

The depleted region generated by an electric field in the interface between the conductive layer 17 or Si layer 11 and the insulating film 15 is smaller compared to that in the case without the conductive layer 17. Since leak current is generated from the depleted region in the interface, it is reduced when the depleted region in the interface is smaller. That is, in the radiation detection element 1, the presence of the conductive layer 17 suppresses the generation of leak current, thereby suppressing electrons not derived from radiation flowing into the signal output electrode 14. Moreover, the collection electrode 13 has a higher potential than the conductive layer 17. Between the curved electrode 12 which is closest to the signal output electrode 14 and the curved electrode 12 which is second closest to the signal output electrode 14, the electrons generated in the depleted region in the interface move through the conductive layer 17 by the electric field, and tend to be collected by the collection electrode 13. The electrons collected by the collection electrode 13 flow from the collection electrode 13 to the outside the radiation detection element 1. As the electrons generated at the interface and moved by the electric field tend to be collected by the collection electrode 13, it is difficult for the electrons to move to a position where the distance from the signal output electrode 14 is shorter than the distance between the collection electrode 13 and the signal output electrode 14. As a result, the electrons cannot easily flow into the signal output electrode 14. In the case where the conductive layer 17 is in contact with the insulating film 15, the electrons generated at the interface between the conductive layer 17 and the insulating film 15 tend to remain at the interface, and do not easily flow to the Si layer 11. The electrons remaining at the interface do not easily flow into the signal output electrode 14.

As such, the electrons not derived from radiation are suppressed from flowing into the signal output electrode 14, and a signal irrelevant to the entrance of radiation being output from the signal output electrode 14 is also suppressed. That is, noise included in the signal output by the signal output electrode 14 is reduced. Therefore, noise generated by the radiation detection element 1 is reduced, while the radiation detector 2 and the radiation detection apparatus may detect radiation with high precision.

Embodiment 2

Figure 7:
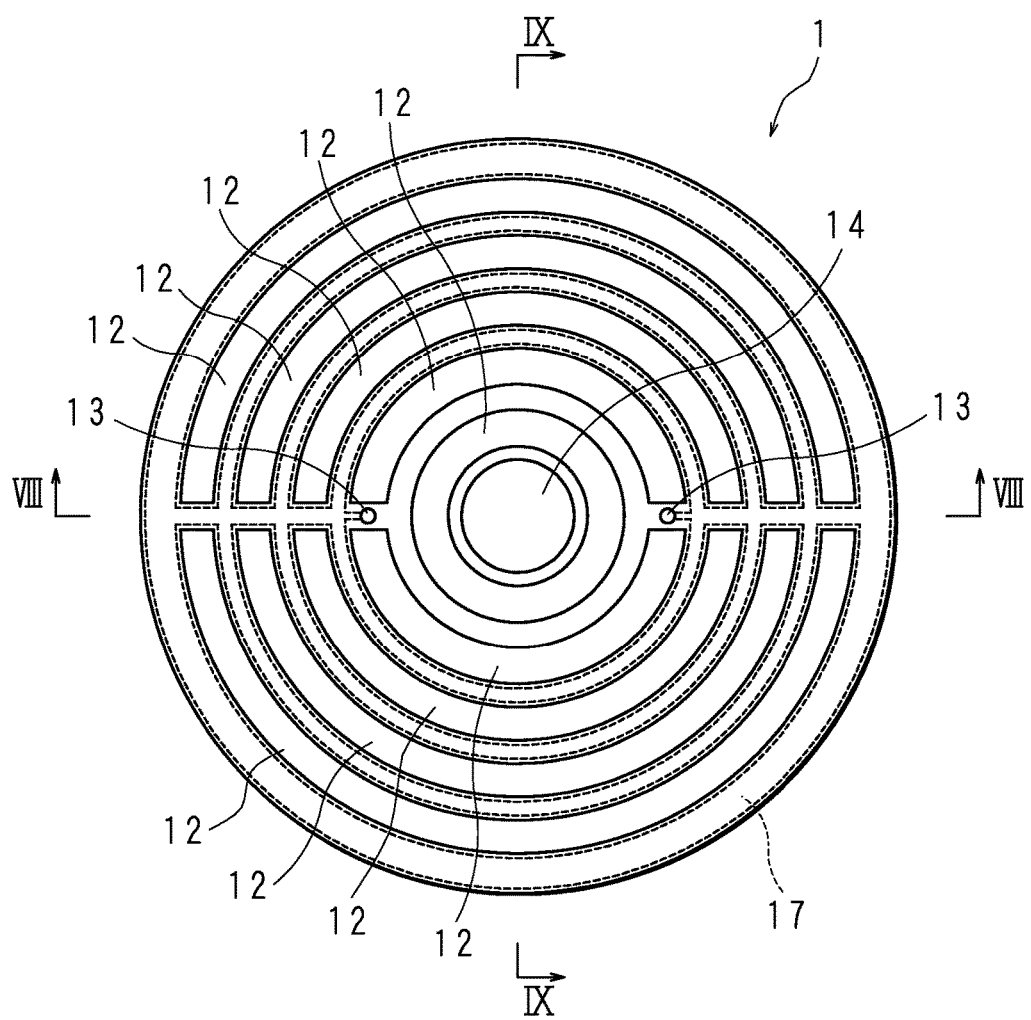
FIG. 7 is a schematic plan view of a radiation detection element according to Embodiment 2.
Figure 8:
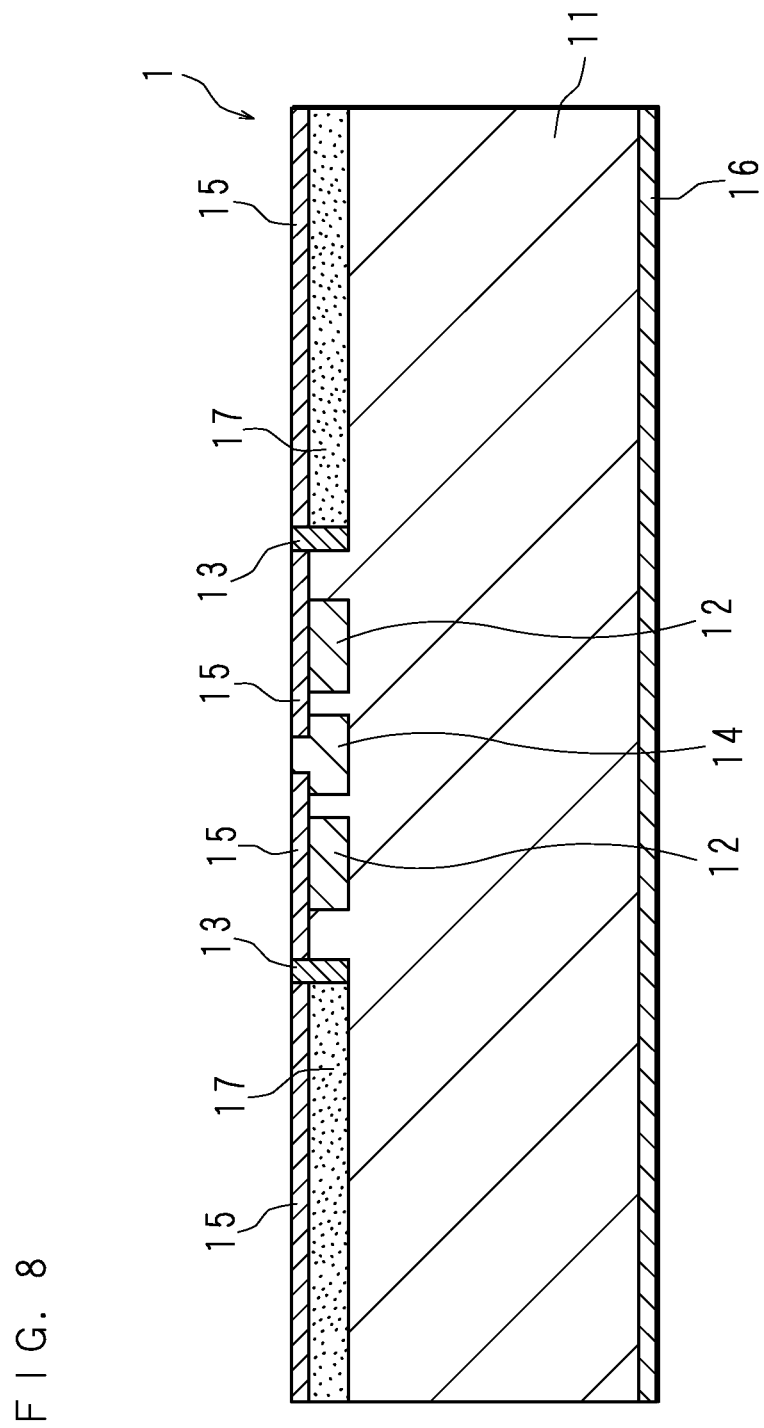
FIG. 8 is a schematic section view of the radiation detection element taken along the line VIII-VIII in FIG. 7.
Figure 9:
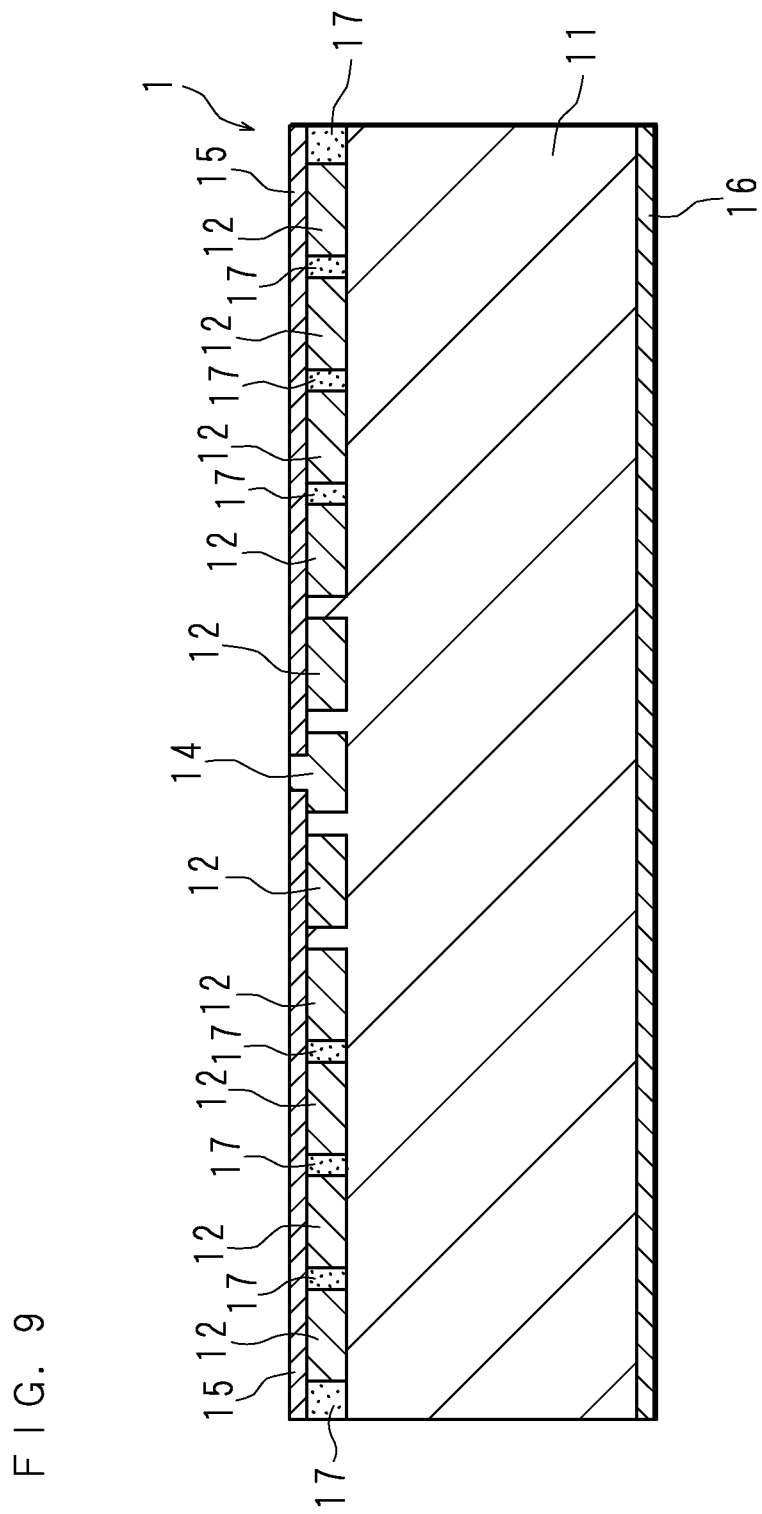
FIG. 9 is a schematic section view of the radiation detection element taken along the line IX-IX in FIG. 7.

FIG. 7 is a schematic plan view of a radiation detection element 1 according to Embodiment 2. FIG. 8 is a schematic section view of the radiation detection element 1 taken along the line VIII-VIII in FIG. 7. FIG. 9 is a schematic section view of the radiation detection element 1 taken along the line IX-IX in FIG. 7. In the present embodiment, the second innermost curved electrode 12 is disconnected at two portions, and collection electrodes 13 are provided at the respective positions of the disconnected portions of the curved electrode 12. The depth at which the conductive layer 17 is provided in the depth direction with respect to the Si layer 11 is equal to or less than the depth at which the curved electrodes 12 are provided. That is, in the depth direction with respect to the Si layer 11, the length of the conductive layer 17 from the interface with the insulating film 15 is equal to or less than the length of the curved electrodes 12 from the interface with the insulating film 15. The curved electrodes 12 are provided to be in contact with the Si layer 11.

As illustrated in FIG. 7, each of the curved electrodes 12 has a shape of a ring with disconnected portions. In FIG. 7, the position of the conductive layer 17 in plan view is indicated by broken lines. As illustrated in FIGS. 7 and 9, the conductive layer 17 includes multiple portions with different distances from the signal output electrode 14. For example, a part of the conductive layer 17 is located at a position between the curved electrodes 12 with different distances from the signal output electrode 14. As illustrated in FIGS. 7 and 8, parts of the conductive layer 17 are provided at disconnected portions of the curved electrodes 12. Multiple portions of the conductive layer 17 at different distances from the signal output electrode 14 are linked together through the parts of the conductive layer 17 located at the disconnected portions of the curved electrodes 12. That is, the conductive layer 17 is continuous. Moreover, the conductive layer 17 is in contact with the collection electrode 13. The other configurations of the radiation detection element 1 are similar to those in Embodiment 1. Furthermore, the radiation detector 2 as well as the radiation detection apparatus provided with the radiation detection element 1 are configured similarly to those in Embodiment 1.

An electric field is generated by the curved electrodes 12 at a portion of the conductive layer 17 between the curved electrodes 12 located at different distances from the signal output electrode 14. That is, in the present embodiment also, inside the conductive layer 17, an electric field in which the potential is increased toward the signal output electrode 14 is generated by the multiple curved electrodes 12. Moreover, the collection electrode 13 has a potential higher than that of the conductive layer 17. In the present embodiment also, the depleted region generated in the interface between the conductive layer 17 or Si layer 11 and the insulating film 15 is smaller than that in the case without the conductive layer 17. Thus, the presence of the conductive layer 17 suppresses the generation of leak current, which suppresses electrons not derived from radiation flowing into the signal output electrode 14.

The electrons in the electric charges not derived from radiation that are generated at or near the interface tend to remain in the conductive layer 17 and tend not to flow into the Si layer 11. The electrons generated in the depleted region out of the electrons not derived from radiation flow through the conductive layer 17 by the electric field and are collected by the collection electrode 13 due to the difference in potential. The electrons generated at a position between the curved electrodes 12 with different distances from the signal output electrode 14 pass through the parts of the conductive layer 17 located between the curved electrodes 12 and through the parts of the conductive layer 17 located at the disconnected portions of the curved electrodes 12, and are collected by the collection electrode 13. Moreover, electrons generated at any portions with different distances from the signal output electrode 14 pass through the parts of the conductive layer 17 located at the disconnected portions of the curved electrodes 12, and are collected by the collection electrode 13. The electrons flowed through the conductive layer 17 are collected by the collection electrode 13, and do not easily flow into the signal output electrode 14.

As such, the electrons not derived from radiation flowing into the signal output electrode 14 are suppressed, and a signal irrelevant to the entrance of radiation being output from the signal output electrode 14 is also suppressed. That is, noise included in the signal output by the signal output electrode 14 is reduced. Therefore, noise generated by the radiation detection element 1 is reduced, while the radiation detector 2 and the radiation detection apparatus may detect radiation with high precision.

Embodiment 3

Figure 10:
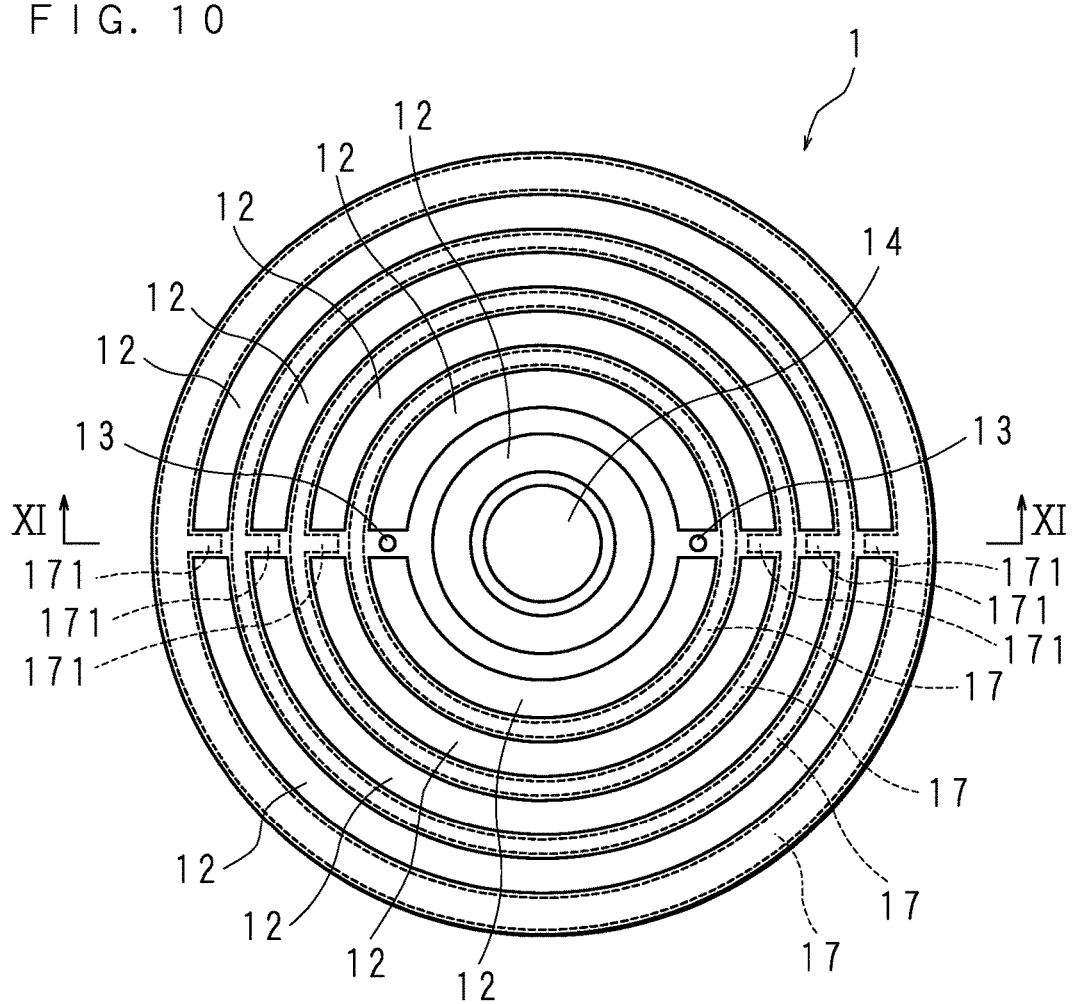
FIG. 10 is a schematic plan view of a radiation detection element according to Embodiment 3.
Figure 11:
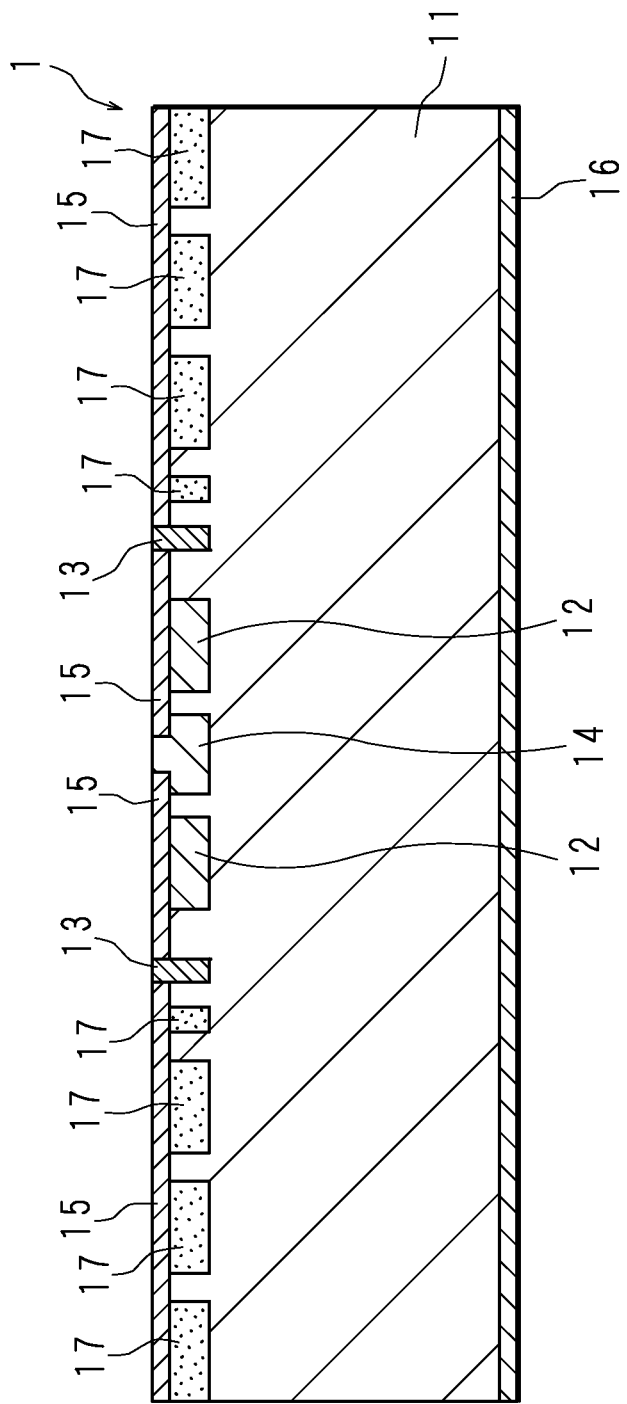
FIG. 11 is a schematic section view of the radiation detection element taken along the line XI-XI in FIG. 10.

FIG. 10 is a schematic plan view of a radiation detection element 1 according to Embodiment 3. FIG. 11 is a schematic section view of the radiation detection element 1 taken along the line XI-XI in FIG. 10. The cross-section structure of the radiation detection element 1 according to Embodiment 3 cut along a plane orthogonal to the line XI-XI is similar to the cross-section structure illustrated in FIG. 9. In FIG. 10, the position of the conductive layer 17 in plan view is indicated by broken lines. The second innermost curved electrode 12 is disconnected at two portions, and collection electrodes 13 are provided at the respective positions of the disconnected portions of the curved electrode 12.

In the present embodiment, the radiation detection element 1 is provided with multiple ring-shaped conductive layers 17 having different distances from the signal output electrode 14. The conductive layers 17 are provided at positions between the curved electrodes 12 with different distances from the signal output electrode 14, and at a position where the distance from the signal output electrode 14 is longer than the distance between the signal output electrode 14 and the curved electrodes 12. The multiple conductive layers 17 are separated from each other. The depth at which the conductive layers 17 are provided in the depth direction with respect to the Si layer 11 is equal to or less than the depth at which the curved electrodes 12 are provided. That is, in the depth direction with respect to the Si layer 11, the length of the conductive layer 17 from the interface with the insulating film 15 is equal to or less than the length of the curved electrode 12 from the interface with the insulating film 15. The curved electrodes 12 are in contact with the Si layer 11. The curved electrode 12 has a shape of a ring with disconnected portions. At a disconnected portion of the curved electrode 12, an extension part 171 is formed by a part of a conductive layer 17 extending toward another conductive layer 17 located closer to the signal output electrode 14. The extension part 171 is separated from another conductive layer 17 located closer to the signal output electrode 14. The conductive layer 17 located closest to the collection electrode 13 is separated from the collection electrode 13. That is, the conductive layers 17 are provided at positions where the distances from the signal output electrode 14 are longer than the distance between the collection electrode 13 and the signal output electrode 14. The other configurations of the radiation detection element 1 is similar to those in Embodiment 1. Furthermore, the radiation detector 2 as well as the radiation detection apparatus provided with the radiation detection element 1 are configured similarly to those in Embodiment 1.

In the present embodiment, an electric field is generated by the curved electrodes 12 at the conductive layer 17 located between the curved electrodes 12 with different distances from the signal output electrode 14. The electric field formed by the curved electrodes 12 increases the potential of the conductive layers 17 toward the signal output electrode 14. Moreover, the collection electrode 13 has a potential higher than that of the conductive layer 17. In the present embodiment also, the depleted region generated in the interface between the conductive layer 17 or Si layer 11 and the insulating film 15 is small. This suppresses the generation of leak current and also suppresses the electrons not derived from radiation flowing into the signal output electrode 14.

The electrons not derived from radiation, generated at or near the interface tend to remain in the conductive layer 17, and tend not to flow into the Si layer 11. The electrons generated in the depleted region out of the electrons not derived from radiation flow through the conductive layer 17. The electrons pass through the conductive layer 17 and through the extension part 171, and move to another conductive layer 17 located closer to the signal output electrode 14 in accordance with the difference in potential. The electrons move between the conductive layers 17 in accordance with the difference in potential, move from the conductive layer 17 closest to the collection electrode 13 to the collection electrode 13, and are collected by the collection electrode 13. Furthermore, the electrons not derived from radiation, generated at and near the interface between the Si layer 11 and the insulating film 15 at a position between the extension part 171 of a conductive layer 17 and another conductive layer 17, move to the conductive layer 17 in accordance with the difference in potential and are collected by the collection electrode 13. Moreover, in the present embodiment also, the electrons not derived from radiation, generated at multiple positions of the radiation detection element 1, are collected by the collection electrode 13. The electrons in the conductive layer 17 tend to be collected by the collection electrode 13, and therefore tend not to move to a position where the distance from the signal output electrode 14 is shorter than the distance between the collection electrode 13 and the signal output electrode 14, and do not easily flow into the signal output electrode 14.

As such, the electrons not derived from radiation flowing into the signal output electrode 14 is suppressed, and a signal irrelevant to the entrance of radiation being output from the signal output electrode 14 is also suppressed. That is, noise included in the signal output by the signal output electrode 14 is reduced. Therefore, noise generated by the radiation detection element 1 is reduced, while the radiation detector 2 and the radiation detection apparatus may detect radiation with high precision. It is to be noted that the conductive layer 17 closest to the collection electrode 13 may be in contact with the collection electrode 13. Furthermore, the radiation detection element 1 may also take a form where the conductive layer 17 is continuous while being separated from the collection electrode 13.

Embodiment 4

Figure 12:
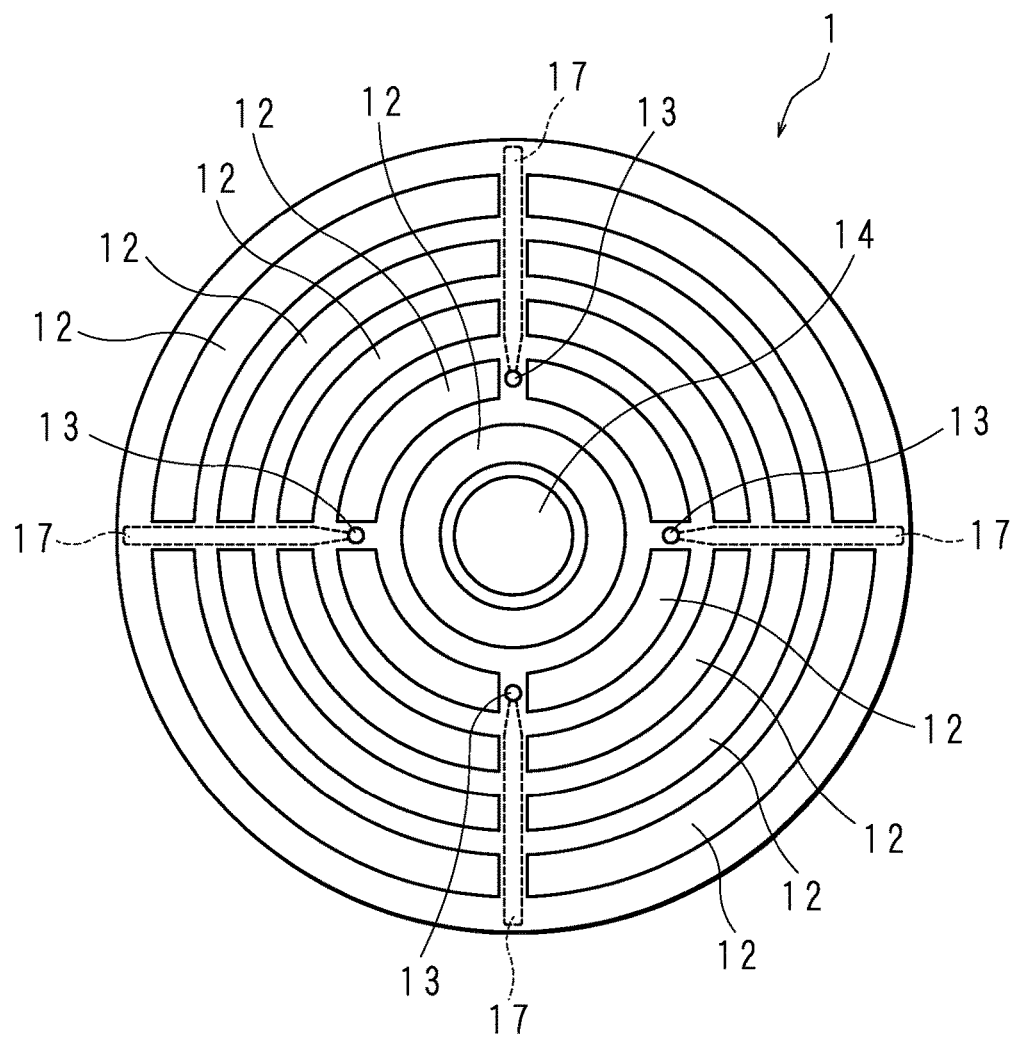
FIG. 12 is a schematic plan view of a radiation detection element according to Embodiment 4.

FIG. 12 is a schematic plan view of a radiation detection element 1 according to Embodiment 4. In FIG. 12, the positions of the conductive layers 17 in plan view are indicated by broken lines. In the present embodiment, the radiation detection element 1 has multiple conductive layers 17 arranged in a radial fashion. Each of the curved electrodes 12 has a shape of a ring with disconnected portions. The conductive layers 17 are respectively provided at the disconnected portions of the curved electrodes 12. The collection electrodes 13 are provided at positions where the second innermost curved electrode 12 is disconnected. The conductive layers 17 are in contact with the respective collection electrodes 13, and extend in a direction in which the distance from the signal output electrode 14 increases. FIG. 12 illustrates an example where the radiation detection element 1 has four collection electrodes 13 and the conductive layers 17 which are in contact with the respective collection electrodes 13 extend. The number of the collection electrodes 13 may be other than four. In the depth direction with respect to the Si layer 11, the length of the conductive layer 17 from the interface with the insulating film 15 is equal to or less than the length of the curved electrode 12 from the interface with the insulating film 15. The other configurations of the radiation detection element 1 is similar to those in Embodiment 1. Furthermore, the radiation detector 2 as well as the radiation detection apparatus provided with the radiation detection element 1 are configured similarly to those in Embodiment 1.

In the present embodiment also, inside the conductive layer 17, an electric field in which the potential is increased toward the signal output electrode 14 is generated by the multiple curved electrodes 12. In the electric charges not derived from radiation, generated at and near the interface between the conductive layer 17 and the insulating film 15 as well as the interface between the Si layer 11 and the insulating film 15, the electrons generated in the depleted region flow through the conductive layer 17 and are collected by the collection electrode 13. This suppresses the electrons not derived from radiation flowing into the signal output electrode 14, and also suppresses a signal irrelevant to the entrance of radiation being output from the signal output electrode 14. That is, noise included in the signal output by the signal output electrode 14 is reduced. Therefore, noise generated by the radiation detection element 1 is reduced, while the radiation detector 2 and the radiation detection apparatus may detect radiation with high precision.

Embodiment 5

Figure 13:
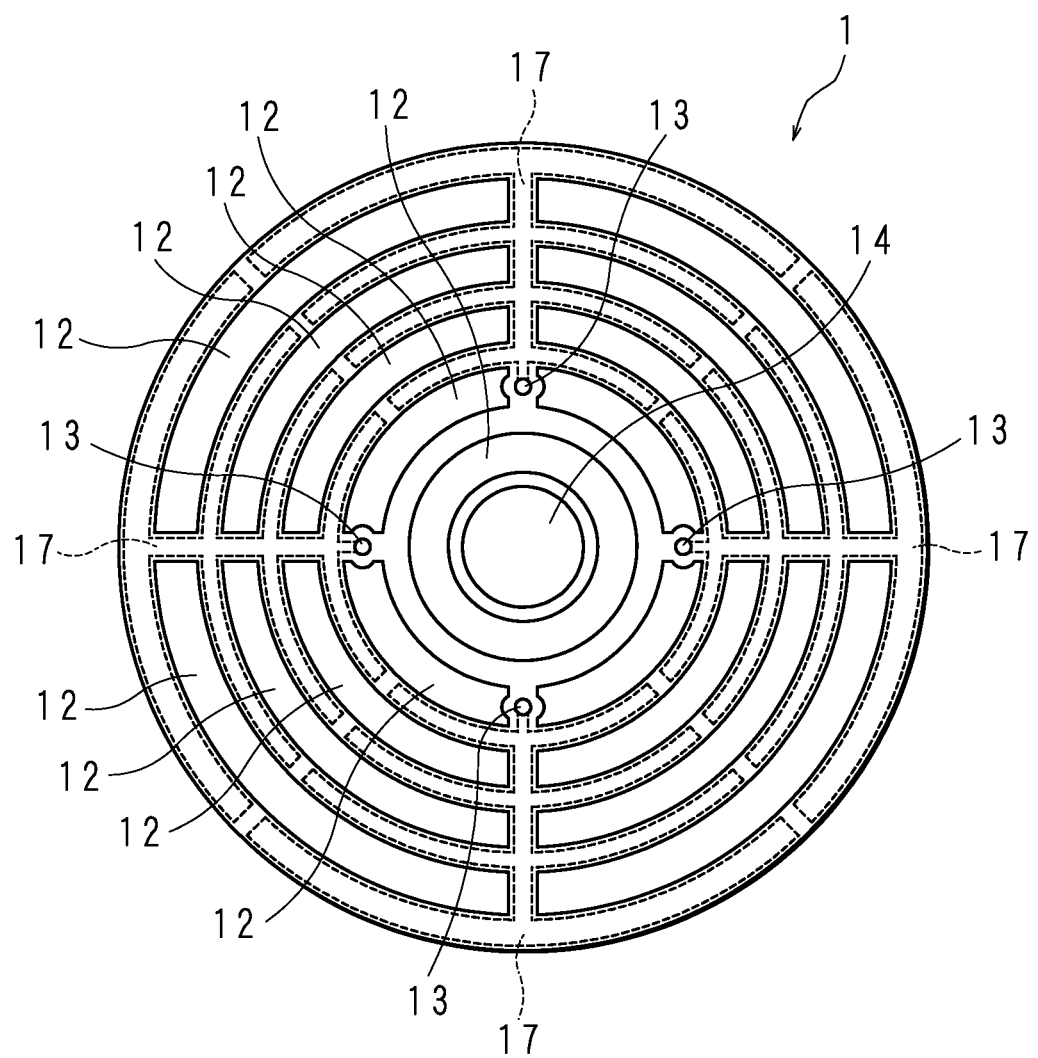
FIG. 13 is a schematic plan view of a radiation detection element according to Embodiment 5.

FIG. 13 is a schematic plan view of a radiation detection element 1 according to Embodiment 5. In FIG. 13, the positions of the conductive layers 17 in plan view are indicated by broken lines. Each of the curved electrodes 12 has a shape of a ring with disconnected portions. In the present embodiment, the radiation detection element 1 has multiple collection electrodes 13, while the conductive layers 17 that are in contact with the respective collection electrodes 13 are provided to extend through the disconnected portions of the curved electrodes 12 in directions in which the distance from the signal output electrode 14 increases. The collection electrodes 13 are provided at positions where the second innermost curved electrode 12 is disconnected. Furthermore, the conductive layers 17 are provided at positions between the curved electrodes 12 with different distances from the signal output electrode 14, and at a position where the distance from the signal output electrode 14 is longer than the distance between the signal output electrode 14 and the curved electrodes 12. While FIG. 13 illustrates an example where the radiation detection element 1 has four collection electrodes 13, the number of the collection electrodes 13 may be other than four. In the depth direction with respect to the Si layer 11, the length of the conductive layer 17 from the interface with the insulating film 15 is equal to or less than the length of the curved electrode 12 from the interface with the insulating film 15. The other configurations of the radiation detection element 1 are similar to those in Embodiment 1. Furthermore, the radiation detector 2 as well as the radiation detection apparatus provided with the radiation detection element 1 are configured similarly to those in Embodiment 1.

In the present embodiment also, inside the conductive layer 17, an electric field in which the potential is increased toward the signal output electrode 14 is generated by the multiple curved electrodes 12. In the present embodiment also, the depleted region generated in the interface between the conductive layer 17 or Si layer 11 and the insulating film 15 is small. This suppresses the generation of leak current and also suppresses the electrons not derived from radiation flowing into the signal output electrode 14. The electrons not derived from radiation that are generated at or near the interface tend to remain in the conductive layer 17 and tend not to flow into the Si layer 11. The electrons generated in the depleted region out of the electrons not derived from radiation flow through the conductive layers 17 and are collected by the collection electrodes 13. The electrons not derived from radiation, generated at positions between the curved electrodes 12 with different distances from the signal output electrode 14, and at a position where the distance from the signal output electrode 14 is longer than the distance between the signal output electrode 14 and the curved electrodes 12, are collected by the collection electrode 13. This suppresses the electrons not derived from radiation flowing into the signal output electrode 14, and also suppresses a signal irrelevant to the entrance of radiation being output from the signal output electrode 14. That is, noise included in the signal output by the signal output electrode 14 is reduced. Therefore, noise generated by the radiation detection element 1 is reduced, while the radiation detector 2 and the radiation detection apparatus may detect radiation with high precision.

While Embodiments 1 to 5 above described the examples where the semiconductor part (Si layer 11) is made of an n-type semiconductor and the curved electrode 12 is made of a p-type semiconductor, the radiation detection element 1 may also take a form where the semiconductor part is made of a p-type semiconductor and the curved electrode 12 is made of an n-type semiconductor. Furthermore, Embodiments 1 to 5 mainly showed examples where electrons generated by radiation are concentrated and flow into the signal output electrode 14, while the radiation detection element 1 may also take a form where holes generated by radiation are concentrated and flow into the signal output electrode 14. In this form, the voltage application part 31 applies voltage such that the potential sequentially and monotonously decreases from the curved electrode 12 which is far from the signal output electrode 14 toward the curved electrode 12 which is close to the signal output electrode 14, and that the potential of the rear electrode 16 is intermediate between the potential of the innermost curved electrode 12 and the potential of the outermost curved electrode 12. The collection electrode 13 is connected to a potential lower than the curved electrode 12 located at a position where the distance from the signal output electrode 14 is longer than the distance between the collection electrode 13 and the signal output electrode 14. The holes generated at the interface between the insulating film 15 and the Si layer 11 or the conductive layer 17 pass through the conductive layer 17, and are collected by the collection electrode 13.

Moreover, the curved electrode 12 may have a shape other than the shape illustrated in Embodiments 1 to 5. For example, the curved electrode 12 may have an arc-like shape. Furthermore, the radiation detection apparatus may also take a form of not being provided with the irradiation part 33 and detecting radiation entering from the outside.

It should be understood that the embodiments disclosed herein are illustrative and non-restrictive in every respect. Since the scope of the present invention is defined by the appended claims rather than by the description preceding them, all changes that fall within metes and bounds of the claims, or equivalence of such metes and bounds thereof are therefore intended to be embraced by the claims.

It is to be noted that, as used herein and in the appended claims, the singular forms "a", "an", and "the" include plural referents unless the context clearly dictates otherwise.

It is to be noted that the disclosed embodiment is illustrative and not restrictive in all aspects. The scope of the present invention is defined by the appended claims rather than by the description preceding them, and all changes that fall within metes and bounds of the claims, or equivalence of such metes and bounds thereof are therefore intended to be embraced by the claims.

What is claimed is:

1. A radiation detection element, comprising:
a semiconductor part generating an electric charge by entrance of radiation;
a signal output electrode provided at the semiconductor part and outputting a signal caused by the electric charge;
a potential gradient generation electrode provided at the semiconductor part, for applying voltage such that a potential gradient in which a potential varies toward the signal output electrode is generated inside the semiconductor part;
a collection electrode provided at the semiconductor part, for collecting electric charges not derived from radiation;
an insulating film provided on a side of the semiconductor part where the signal output electrode is located; and
a conductive layer provided between the insulating film and a part of the semiconductor part, and having electric resistance lower than electric resistance of the semiconductor part and higher than electric resistance of the collection electrode,
wherein the conductive layer is located at a position where a distance from the signal output electrode is equal to or longer than a distance between the collection electrode and the signal output electrode.

2. The radiation detection element according to claim 1, further comprising
a plurality of potential gradient generation electrodes at different distances from the signal output electrode,
wherein the conductive layer is located at a position between the plurality of potential gradient generation electrodes.

3. The radiation detection element according to claim 1, further comprising
a plurality of conductive layers located at different distances from the signal output electrode.

4. The radiation detection element according to claim 3, wherein
the potential gradient generation electrode has a shape of a ring with a disconnected portion, and
electric charges move between the plurality of conductive layers through the disconnected portion of the potential gradient generation electrode.

5. A radiation detector, comprising:
the radiation detection element according to claim 1;
a circuit board on which the radiation detection element is mounted; and
a base plate for holding the radiation detection element and the circuit board.

6. A radiation detection apparatus, comprising:
the radiation detection element according to claim 1;
an output part outputting a signal corresponding to energy of radiation detected by the radiation detection element; and
a spectrum generation part generating a spectrum of the radiation based on the signal output by the output part.

7. A radiation detection apparatus, comprising:
an irradiation part irradiating a sample with radiation;
the radiation detection element according to claim 1 detecting radiation generated from the sample;
an output part outputting a signal corresponding to energy of radiation detected by the radiation detection element;
a spectrum generation part generating a spectrum of the radiation based on the signal output by the output part; and
a display part displaying a spectrum generated by the spectrum generation part.

* * * * *